(12) United States Patent
Kadota

(10) Patent No.: US 6,590,336 B1
(45) Date of Patent: Jul. 8, 2003

(54) LIGHT EMITTING DEVICE HAVING A POLAR PLANE PIEZOELECTRIC FILM AND MANUFACTURE THEREOF

(75) Inventor: Michio Kadota, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 337 days.

(21) Appl. No.: 09/652,597

(22) Filed: Aug. 30, 2000

(30) Foreign Application Priority Data

Aug. 31, 1999 (JP) .......................................... 11-245921

(51) Int. Cl.7 ............................................. H05B 33/00
(52) U.S. Cl. ............................ 313/508; 257/94; 257/96
(58) Field of Search ................................ 313/508, 498, 313/499; 257/10, 94, 43, 96, 97, 98, 103

(56) References Cited

U.S. PATENT DOCUMENTS

| | | | | |
|---|---|---|---|---|
| 5,432,397 A | * | 7/1995 | Koike et al. ................. 310/358 |
| 5,604,763 A | * | 2/1997 | Kato et al. ..................... 372/45 |
| 6,057,561 A | * | 5/2000 | Kawasaki et al. ............. 257/94 |
| 6,437,363 B1 | * | 8/2002 | Kadota et al. ................. 257/43 |
| 6,448,585 B1 | * | 9/2002 | Kadota ....................... 257/103 |

FOREIGN PATENT DOCUMENTS

| | | |
|---|---|---|
| EP | 0383215 | 8/1990 |
| EP | 0383215 A2 | 8/1990 |
| EP | 0905799 A2 | 3/1999 |
| EP | 0905799 | 3/1999 |
| JP | 7-262801 | 10/1995 |
| JP | 10-256673 | 9/1998 |

OTHER PUBLICATIONS

German Office Action dated Apr. 29, 2002, with English translation.

T. Ohnishi, et al.: Determination of surface polarity of c–axis oriented ZnO films by coaxial impact–collision ion scattering spectroscopy. In: Applied Physics Letters, ISSN 0003–6951, vol. 72, No. 8, 1998, pp. 824–826.

P. Kung, et al.: Laterial epitaxial overgrwoth of GaN films on sapphire and silicon substrate. In: Applied Physics Letters, ISSN 0003–6951, vol. 74, No. 4, 1999, pp. 570–572.

* cited by examiner

*Primary Examiner*—Vip Patel
*Assistant Examiner*—Joseph Williams
(74) *Attorney, Agent, or Firm*—Dickstein, Shapiro, Morin & Oshinsky, LLP.

(57) ABSTRACT

The light emitting device comprises: a substrate; and a first piezoelectric film held on the substrate and having one of a positive plane and a negative plane, the first piezoelectric film functioning as a light emitting layer.

20 Claims, 7 Drawing Sheets

LIGHT EMITTING DEVICE HAVING A POLAR PLANE PIEZOELECTRIC FILM AND MANUFACTURE THEREOF

BACKGROUND OF THE INVENTION

1. Field of the Invention

The present invention relates to light emitting devices and more particularly to light emitting devices having luminescent layers comprising piezoelectric material.

2. Description of the Related Art

Piezoelectric thin-films have been widely used in vibrators, such as piezoelectric resonators and piezoelectric actuators, and driving devices. In recent years, piezoelectric thin-films also have attracted attention as optical devices. For example, Japanese Unexamined Patent Application Publication No. 7-262801 discloses a light emitting device which has a ZnO film formed on a sapphire substrate and emits ultraviolet light by the effects of excitons. Moreover, Japanese Unexamined Patent Application Publication No. 10-256673 discloses a light emitting device which emits ultraviolet light by laser oscillation.

Properties of piezoelectric films, however, have not been sufficiently known. In particular, properties of piezoelectric films suitable for light emitting devices and methods for making the piezoelectric films have not yet been sufficiently studied. Thus, piezoelectric films used in conventional light emitting devices do not have high luminous efficiency.

SUMMARY OF THE INVENTION

Accordingly, it is an object of the present invention to provide a light emitting device having high luminous efficiency and high luminous intensity. The light emitting device comprises: a substrate; and a first piezoelectric film held on the substrate and having one of a positive plane and a negative plane, the first piezoelectric film functioning as a light emitting layer.

According to another aspect of the present invention, a method for making a light emitting device comprises the steps of: preparing a substrate; and forming a first piezoelectric film having one of a positive (+) upper plane and negative (−) upper plane on the substrate, according to properties of the substrate.

When the first piezoelectric film has the positive plane, it is preferable that the substrate is selected from the group consisting of a c-plane sapphire substrate, an R-plane sapphire substrate, an m-plane sapphire substrate, an X-plane sapphire substrate, an a-plane sapphire substrate, a rotated Y-cut plate sapphire substrate, a double rotated sapphire substrate, a rotated Y-cut plate quartz substrate, a Z-plane quartz substrate, a $LiTaO_3$ substrate having a negative Z plane of a rotated Y-cut plate, and a $LiNbO_3$ substrate having a negative Z plane of a rotated Y-cut plate.

When the first piezoelectric film has the negative plane, it is preferable that the substrate is selected from the group consisting of a $LiNbO_3$ substrate having a positive Z plane of a rotated Y-cut plate $LiNbO_3$ substrate, a $LiTaO_3$ substrate having a positive Z plane of a rotated Y-cut plate $LiTaO_3$ substrate, a $LiTaO_3$ substrate having a positive Z plane, a $LiNbO_3$ substrate having a positive Z plane, a glass substrate, A Si substrate, a metal substrate, and a substrate having a metal film thereon.

The first piezoelectric film preferably comprises a material selected from ZnO, AlN, and CdS.

The light emitting device may further comprises a second piezoelectric film, the first piezoelectric film and the second piezoelectric film having different conductivity types.

In the light emitting device, the substrate may have a plurality of metal film stripes thereon, the first piezoelectric film covers the metal film stripes, and the first piezoelectric film has the negative plane.

According to the present invention, a piezoelectric film having a positive plane or a negative plane is selectively provided depending on the type of the substrate, and the piezoelectric film has high crystallinity. Thus, the resulting light emitting device has high brightness and high luminescent efficiency.

DESCRIPTION OF THE PREFERRED EMBODIMENTS

Figure 1:
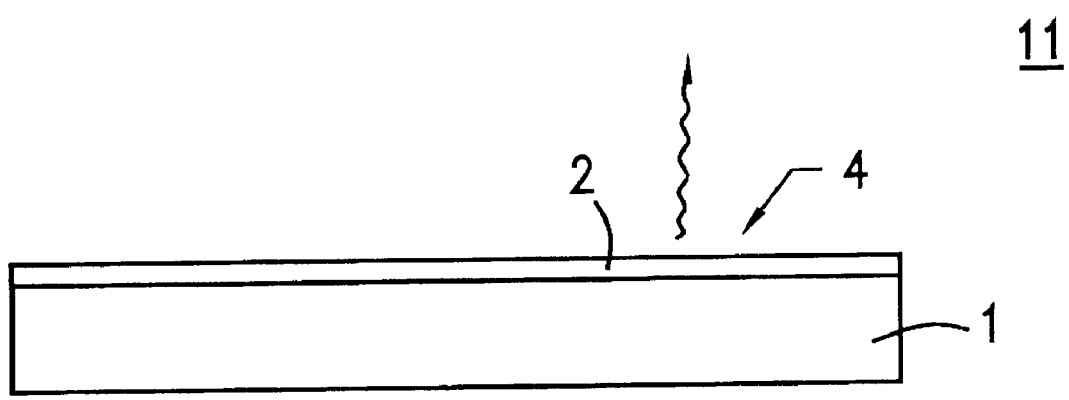
FIG. 1 is a schematic cross-sectional view of a light emitting device in accordance with a first embodiment of the present invention.

The inventor of the present invention found useful facts based on the relationships between physical properties of the piezoelectric film used in the light emitting device and the orientation thereof, and between the substrate type and the orientation of the piezoelectric film suitable for the substrate. When the orientation direction of the piezoelectric film is appropriately selected based on the substrate type, the crystallinity of the piezoelectric film is improved, and the light emitting device exhibits satisfactory properties. These relationships were not previously clear, and the attention to the relationships is itself unique.

The positive plane and the negative plane in the present invention represent the orientation direction of the piezoelectric film and indicate the sign of charge occurring on the main outer surface of the thin film. That is, the positive plane indicates a plane which is positively charged due to the tension caused at load the piezoelectric film, whereas the negative plane indicates a plane which is negatively charged due to tension caused at the piezoelectric film. In the case where the piezoelectric film is a ZnO, AlN or CdS film, it is thought that the positive plane there of has a Zn, Al or Cd layer at the very surface of the positive plane, and that the negative plane thereof has a O, N or Cd at the very surface of the negative plane.

More specifically, when a piezoelectric film is formed on a piezoelectric substrate having a negative plane such as a c-plane sapphire substrate, an R-plane sapphire substrate, an m-plane sapphire substrate, an a-plane sapphire substrate, a rotated Y-cut plate sapphire substrate, a double rotated Y-cut plate sapphire substrate, a rotated Y-cut plate quartz substrate, a Z-plane quartz substrate, a LiTaO$_3$ substrate having a negative Z plane, or a LiNbO$_3$ substrate having a negative Z plane, a ZnO film is formed on the substrate so that the outer surface of the piezoelectric film is a positive plane (the inner surface in contact with the substrate is a negative plane). No polarization treatment of the LiTaO$_3$ substrate is required. The negative Z plane indicates a plane, which is negatively charged due to tension of planes in the Z-axis direction (Z planes). It is to be noted that, as long as the plane is charged uniformly with a negative charge, the plane may be slightly deviated from in the Z-axis direction.

Alternatively, when a piezoelectric film is formed on a piezoelectric substrate having a positive plane such as a LiNbO$_3$ substrate having a positive Z plane of a rotated Y-cut plate LiNbO$_3$ substrate, a LiTaO$_3$ substrate having a positive Z plane of a rotated Y-cut plate LiTaO$_3$, a LiNbO$_3$ substrate having a positive Z plane, and a LiTaO$_3$ substrate having a positive Z plane, a glass substrate or a Si substrate, a metal substrate, or a substrate having a metal film thereon, a ZnO film is formed on the substrate so that the outer surface of the piezoelectric film is a negative plane (the inner surface in contact with the substrate is a positive plane).

Preferably, the first piezoelectric film on the substrate comprises a material selected from ZnO, AlN, and CdS. In devices which emit ultraviolet light, the piezoelectric film preferably comprises ZnO.

The charging characteristics of the piezoelectric film on the substrate are determined by the method for making the piezoelectric film, fabrication conditions, and surface treatment of the substrate. For example, when the piezoelectric film is formed in an ECR system, such as an ECR plasma enhanced CVD system or an ECR sputtering system, an increased microwave power (e.g., more than 300 W) or an elevated heating temperature (e.g., more than 500° C.) readily forms a positive plane. In particular, a piezoelectric film formed on a substrate and heated at a temperature of 1,000° C. or more for several hours in a N$_2$, O$_2$, H$_2$O or air atmosphere has a satisfactory positive plane. Also, the substrate bias voltage controls the polarity (the formation of the positive plane or the negative plane). In a sputtering system, the polarity of the piezoelectric film can be readily controlled by adjusting the gas composition in the deposition system, the heating temperature of the substrate and the bias voltage applied to the substrate. In particular, a bias voltage in a range of −500 V to +500 V is effective for controlling the polarity.

By forming a piezoelectric film having a positive plane or a negative plane depending on the type of the substrate, the resulting light emitting device exhibits high luminous intensity.

FIG. 1 is a schematic cross-sectional view of a light emitting device 11 in accordance with a first embodiment of the present invention. The light emitting device 11 includes a substrate 1 and a ZnO thin-film 2 formed thereon. When the substrate 1 is a c-plane sapphire substrate, an R-plane sapphire substrate, an m-plane sapphire substrate, an a-plane sapphire substrate, a rotated Y-cut plate sapphire substrate, a double rotated sapphire substrate, a rotated Y-cut plate quartz substrate, a Z-plane quartz substrate, a LiTaO$_3$ substrate having a negative Z plane or a LiNbO$_3$ substrate having a negative Z plane, the ZnO thin-film 2 has a positive Z plane. On the other hand, when the substrate 1 is a LiNbO$_3$ substrate having a positive Z plane of a rotated Y-cut plate LiNbO$_3$ substrate, a LiTaO$_3$ substrate having a positive Z plane of a rotated Y-cut plate LiTaO$_3$ substrate, a LiTaO$_3$ substrate having a positive Z plane, a LiNbO$_3$ substrate having a positive Z plane, a glass substrate, a Si substrate, a metal substrate or a substrate having a metal film thereon, the ZnO thin-film 2 has a negative Z plane.

The light emitting device 11 emits light by the effects of excitons or by recombination of electrons with holes. As shown in FIG. 1, when the ZnO thin-film 2 is irradiated with a He-Cd laser (as indicated at 4), the light emitting device 11 emits 370-nm light corresponding to the band gap of ZnO by photoluminescence.

The following experimental results show that the above combinations provide piezoelectric films having high crystallinity. In the experiments, using c-plane sapphire substrate and a Z-plane quartz substrate, piezoelectric films were formed under various deposition conditions and in various substrate surface states, and the orientation of each ZnO thin-film was observed using a nonlinear dielectric microscope. Specifically, three samples were prepared in an ECR sputtering system under the following conditions.

| Condition 1 | |
|---|---|
| Microwave power: | 100 W |
| RF power: | 300 W |
| Substrate temperature: | 200° C. |
| Ar/O$_2$ partial pressure ratio: | 70/30 |
| Condition 2 | |
| Microwave power: | 500 W |
| RF power: | 450 W |
| Substrate temperature: | 500° C. |
| Ar/O$_2$ partial pressure ratio: | 70/30 |
| Condition 3 | |
| Microwave power: | 300 W |
| RF power: | 400 W |
| Substrate temperature: | 450° C. |
| Ar/O$_2$ partial pressure ratio: | 70/30 |

Nonlinear dielectric micrographs of the piezoelectric films prepared under these conditions. The piezoelectric film prepared under Condition 1 was found to be neither a positive plane nor a negative plane on the whole. Under Condition 2, the film was a uniformly distributed positive plane and under Condition 3, the film was a uniformly distributed negative plane. Thus, the piezoelectric film can have a positive plane, a negative plane, or a nonpolar plane depending on the ECR sputtering conditions.

Under conditions other than Conditions 2 and 3, the piezoelectric film having the negative plane can be readily formed by applying a positive bias voltage to the substrate, whereas the piezoelectric film having the positive plane can be readily formed by applying a positive bias voltage.

Figure 2:
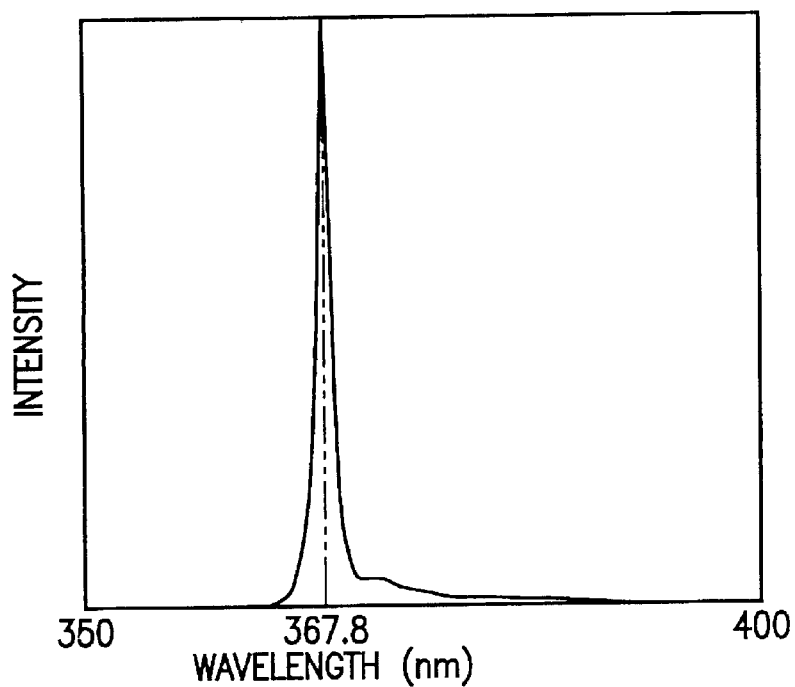
FIG. 2 is a luminescence spectrum of a ZnO thin-film having a positive plane, formed on a c-plane sapphire substrate.
Figure 3:
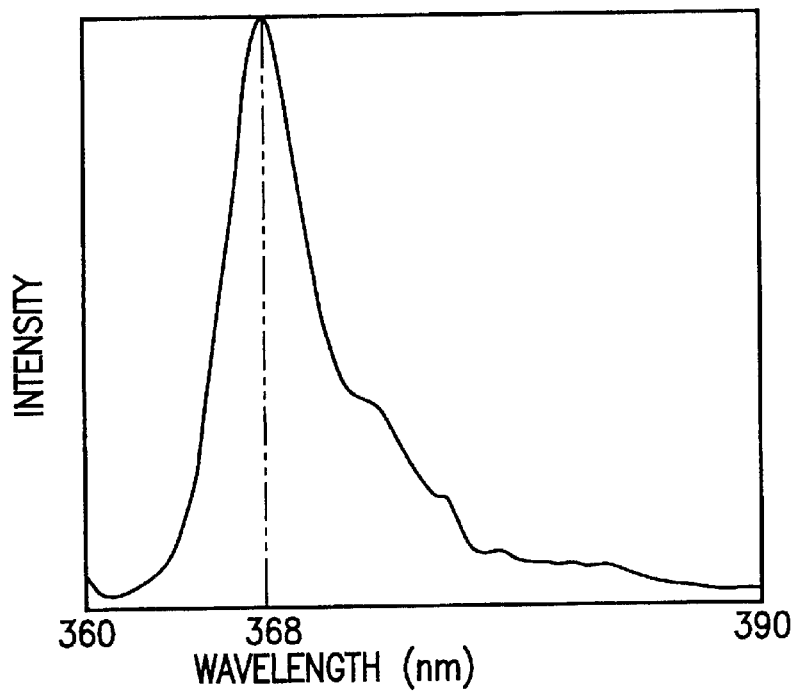
FIG. 3 is a luminescence spectrum of a ZnO thin-film having a positive plane, formed on a Z-plane quartz substrate.

Each light emitting device was irradiated with a He—Cd laser to measure photoluminescence. FIG. 2 is a luminescence spectrum in a range of 350 to 400 nm of the ZnO thin-film having the positive plane formed on the c-plane sapphire substrate. FIG. 3 is a luminescence spectrum in a range of 360 to 390 nm of the ZnO thin-film having the positive plane, formed on the Z-plane quartz substrate. The spectrum shown in FIG. 2 has an intense luminescence peak at 367.8 nm which corresponds to the excitons. The spectrum shown in FIG. 3 also has a peak at 368 nm.

Figure 4:
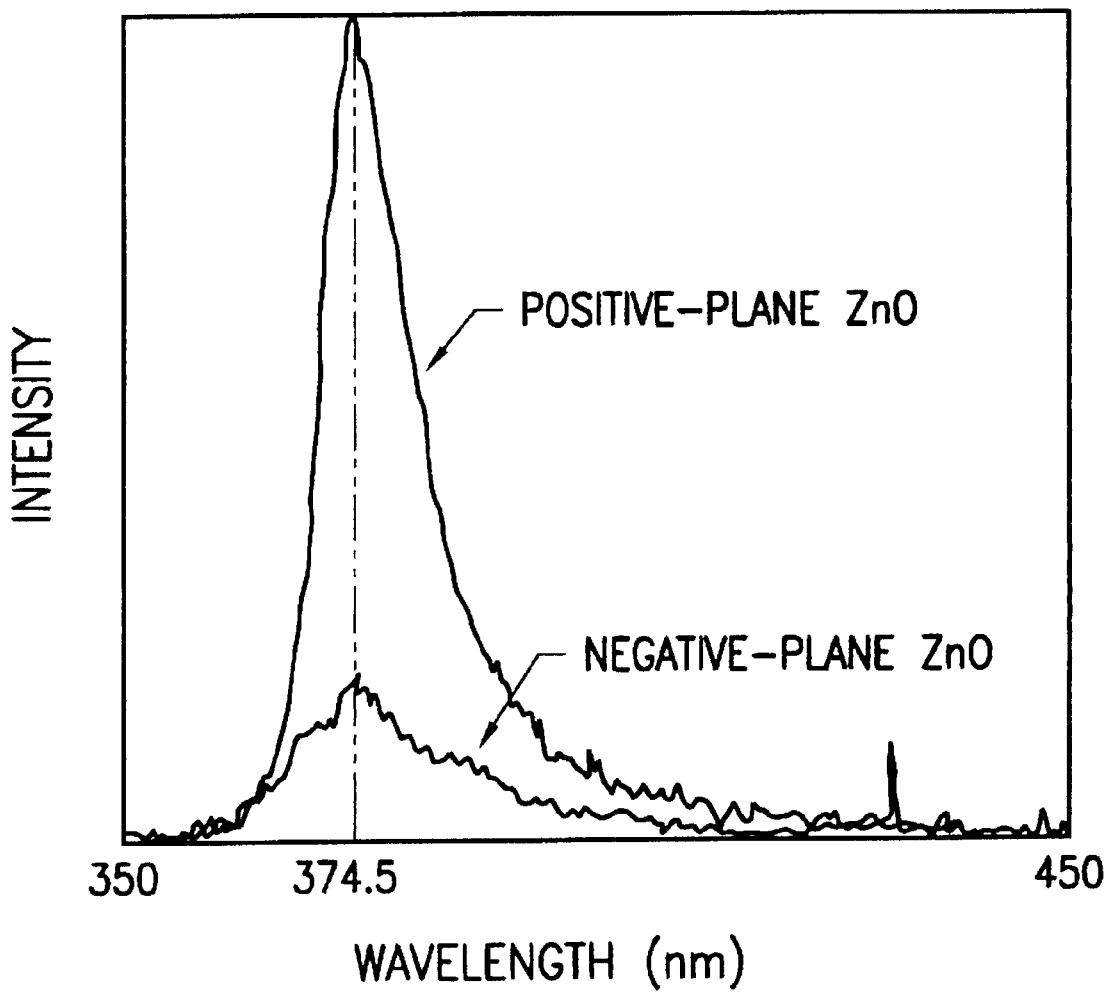
FIG. 4 is a graph of the luminous intensity of a ZnO thin-film having a positive plane on a c-plane sapphire substrate and that of a ZnO thin-film having a negative plane on a c-plane sapphire substrate.

FIG. 4 shows the luminous intensity of the ZnO thin-film having the positive plane on the c-plane sapphire substrate and that of the ZnO thin-film having the negative plane on the c-plane sapphire substrate. The results indicate that the ZnO thin-film having the positive plane has a luminous intensity which is approximately five times the luminous intensity of the ZnO thin-film having the negative plane, and has a narrower half width. Thus, the ZnO thin-film having the positive plane formed on the c-plane sapphire substrate has superior properties.

Figure 5:
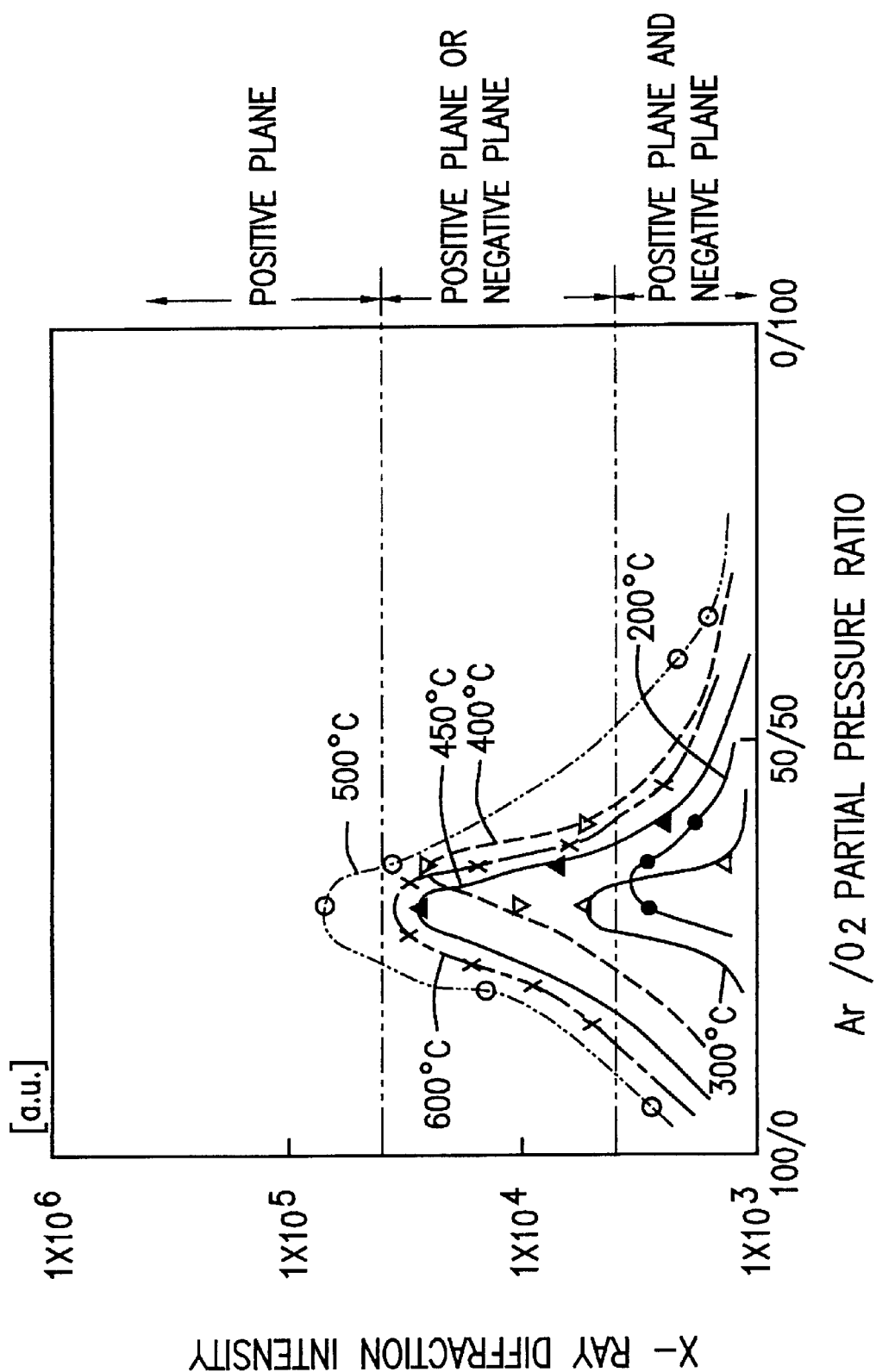
FIG. 5 is a graph showing the X-ray diffraction intensity of ZnO thin-films having positive planes formed on c-plane sapphire substrates.

FIG. 5 is a graph showing the X-ray diffraction intensity of ZnO thin-films having positive planes formed on the c-plane sapphire substrates under different conditions. In FIG. 5, the abscissa indicates the partial pressure ratio of Ar to $O_2$ in a gaseous environment for forming the ZnO thin-films, while the ordinate indicates the X-ray diffraction intensity (relative value) of the ZnO thin-films. These values are measured at substrate temperatures in a range of 200° C. to 600° C. As shown in FIG. 5, the ZnO thin-film has the positive plane at an intensity exceeding $4\times10^4$ (arbitrary units) or has both a positive plane region and a negative plane region at an intensity of less than $4\times10^3$. The ZnO thin-film may have the positive plane or negative plane in an intensity between $4\times10^4$ and $4\times10^3$, showing uncontrolled film deposition. A similar tendency is observed when the ZnO thin-film is formed on the Z-plane quartz substrate.

Figure 6:
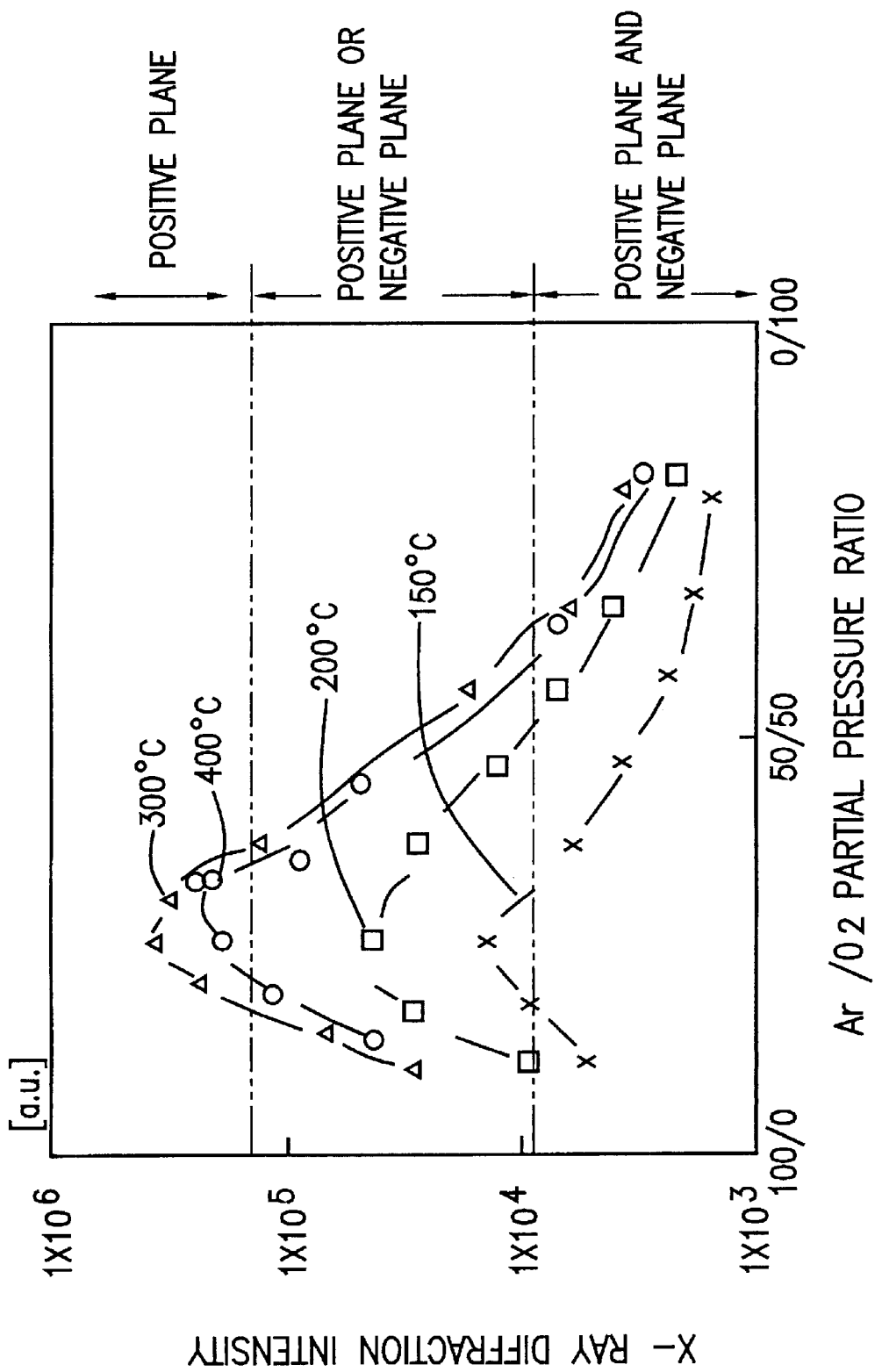
FIG. 6 is a graph showing the X-ray diffraction intensity of ZnO thin-films having positive planes formed on negative Z plane $LiNbO_3$ substrates.

FIG. 6 shows the results when ZnO thin-films are formed on the negative Z plane $LiNbO_3$ substrates. In this case, the ZnO thin-film has the positive plane at an intensity exceeding $1.4\times10^5$ (arbitrary units) or has both a positive plane region and a negative plane region at an intensity of less than $9\times10^3$. The ZnO thin-film may have the positive plane or negative plane in an intensity between $1.4\times10^5$ and $9\times10^3$, showing uncontrolled film deposition. A similar tendency is observed when the ZnO thin-film is formed on the Z-plane quartz substrate.

As shown in FIGS. 5 and 6, the partial pressure ratio of Ar to $O_2$ controls the orientation of the ZnO thin-film, and the ZnO thin-film has a satisfactory positive plane at a partial pressure ratio of 75/25 to 65/35. When the ZnO thin-film having the positive plane is formed on the c-plane sapphire substrate, the orientation of the ZnO thin-film is improved by heating the substrate to 500° C. or more. When the ZnO thin-film having the positive plane is formed on the $LiNbO_3$ substrate having the negative plane, the orientation of the ZnO thin-film is improved by heating the substrate to 300° C. or more.

In addition to the ZnO thin-film, an AlN thin-film having a positive plane or a CdS thin film may be formed on a c-plane sapphire substrate, an R-plane sapphire substrate, an m-plane sapphire substrate, an a-plane sapphire substrate, a rotated Y-cut plate sapphire substrate, a double rotated sapphire substrate, a rotated Y-cut plate quartz substrate, a Z-plane quartz substrate, a $LiTaO_3$ substrate having a negative Z plane, or a $LiNbO_3$ substrate having a negative Z plane, in order to form a light emitting device having satisfactory luminescent properties.

Figure 7:
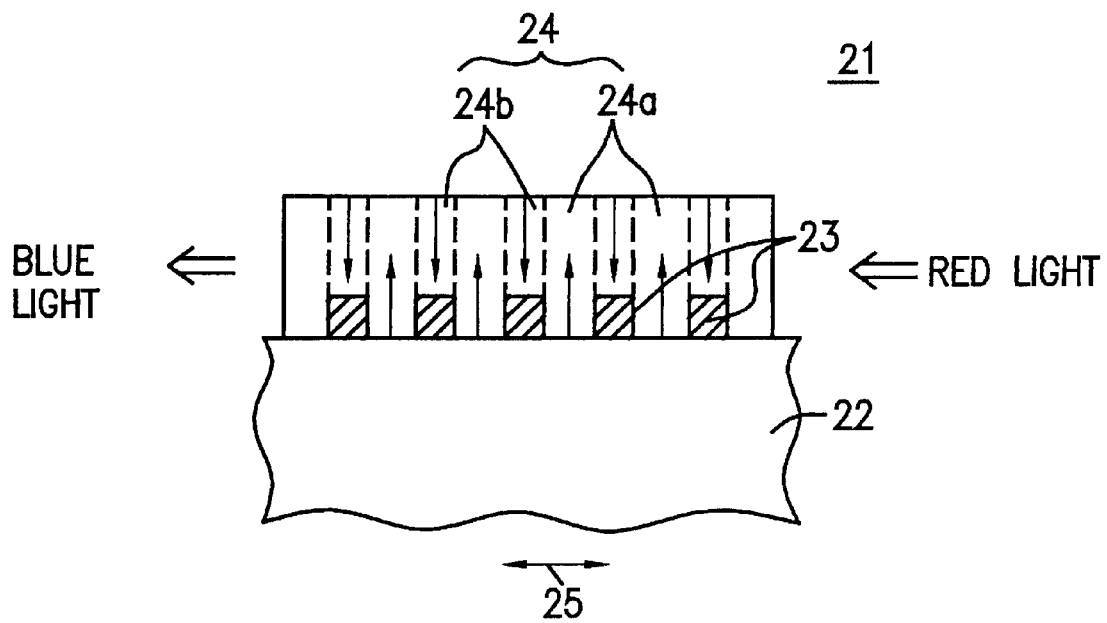
FIG. 7 is a schematic cross-sectional view of a light emitting device in accordance with a second embodiment of the present invention.

FIG. 7 is a schematic cross-sectional view of a light emitting device 21 in accordance with a second embodiment of the present invention. The light emitting device 21 includes a c-plane sapphire substrate 22, a plurality of Al film stripes 23 which are formed with a predetermined interval on the c-plane sapphire substrate 22, and a ZnO thin-film 24 which is formed on the c-plane sapphire substrate 22 so as to cover the Al film stripes 23. That is, the ZnO thin-film 24 is composed of regions 24b lying on the Al film stripes 23 and regions 24a directly lying on the c-plane sapphire substrate 22, and the regions 24a and the regions 24b are alternately arranged in the direction 25. Each region 24b has a negative plane, whereas each region 24a has a positive plane. That is, the ZnO thin-film on the c-plane sapphire substrate 22 has a uniform positive plane, and the ZnO thin-film on the Al film stripes 23 has a negative plane. Other substrates suitable for forming the ZnO thin-film having the positive plane may be used instead of the c-plane sapphire substrate 22. Examples of such substrates are the rotated Y-cut plate quartz substrate and the Z-plane quartz substrate.

Since the c-plane sapphire substrate and the Al film stripes have different orientation characteristics with respect to the ZnO thin-film, the alternating arrangement of negative regions and positive regions is achieved under optimized deposition conditions. For example, a positive bias voltage and a negative bias voltage are applied to the Al film and the sapphire film, respectively.

The light emitting device 21 functions as a second-harmonic generation (SHG) device. As shown in FIG. 10, when red light is incident on one side face of the ZnO thin-film 24 along the direction 25, blue light is emitted from the other side face of the ZnO thin-film 24. Thus, the present invention can provide a SHG device having satisfactory properties.

Figure 8:
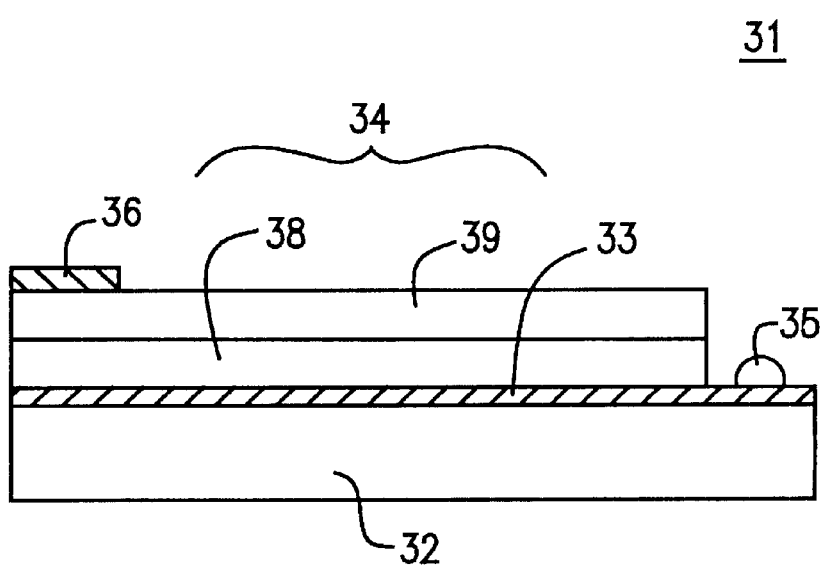
FIG. 8 is a schematic cross-sectional view of a light emitting device in accordance with a third embodiment of the present invention.

FIG. 8 is a schematic cross-sectional view of a light emitting device 31 in accordance with a third embodiment of the present invention. The light emitting device 31 includes a c-plane sapphire substrate 32, an n-type ZnO layer 33 formed on the c-plane sapphire substrate 32, a ZnO active layer 38, and a p-type ZnO layer 39. The upper face of the n-type ZnO layer 33 is a positive plane. Also, the upper faces of the ZnO active layer 38 and the p-type ZnO layer 39 are positive planes. The ZnO active layer 38 and the p-type ZnO layer 39 constitute a light emitting section 34. The n-type ZnO layer 33 is doped with a Group III element, such as aluminum, as a dopant, and exhibits low resistance. The p-type ZnO layer 39 is doped with a Group V element, such as P or As. Electrodes 35 and 36 are formed on the n-type ZnO layer 33 and the p-type ZnO layer 39, respectively. A current flows via the electrodes 35 and 36 and excitons induce luminescence in the light emitting section 34.

Since the ZnO active layer 38 having the positive plane and the p-type ZnO layer 39 having the positive plane are formed on the n-type ZnO layer 33 having the positive plane, the light emitting section 34 has high crystallinity, and the light emitting device 31 exhibits high brightness and high luminous efficiency.

The n-type ZnO layer 33 is provided on the c-plane sapphire substrate 32 in this embodiment. Alternatively, the positions of the n-type ZnO layer 33 and the p-type ZnO layer 39 may be exchanged to invert the conductivity type. That is, a p-type ZnO layer may be formed on the c-plane sapphire substrate 32 and an n-type ZnO layer may be formed on the ZnO active layer 38.

Figure 9:
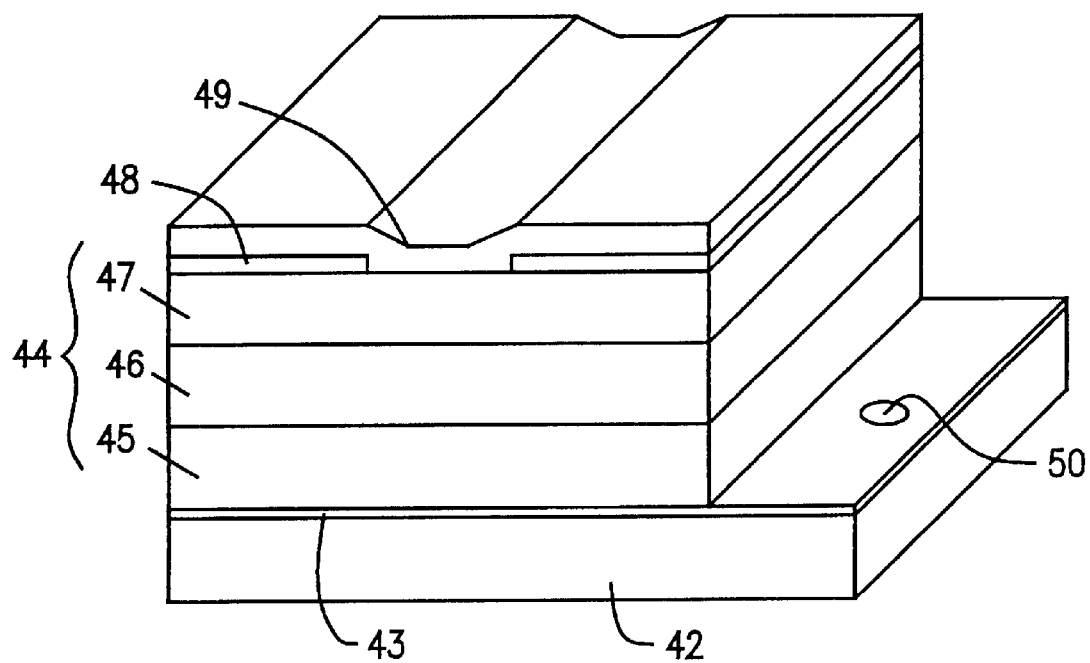
FIG. 9 is a schematic cross-sectional view of a light emitting device in accordance with a fourth embodiment of the present invention.

FIG. 9 is a schematic view of a light emitting device 41 in accordance with a fourth embodiment of the present invention. The light emitting device 41 is of an edge emitting type, such as a laser diode or an edge emitting type diode. The light emitting device 41 includes a sapphire substrate 42, a low-resistance ZnO layer 43 formed on the sapphire substrate 42, and a light emitting section 44. The sapphire substrate 42 has a C-, R-, m-, or a-plane, or is a rotated Y-cut or double rotated plate sapphire substrate, and the low-resistance ZnO layer 43 has a positive plane as the upper surface. The light emitting section 44 includes a p-type ZnO layer 45, a ZnO active layer 46, and an n-type ZnO layer 47. Each of these layers 45 to 47 has a positive plane as the upper face by the effect of the orientation of the low-resistance ZnO layer 43.

A $SiO_2$ film 48 having a slit thereon is provided on the light emitting section 44, and an upper electrode 49 is provided on the $SiO_2$ film 48 to cover the slit. The light emitting section 44 is partly etched so as to partly expose the low-resistance ZnO layer 43, and a lower electrode 50 is provided on the exposed low-resistance ZnO layer 43.

When a current flows in the light emitting device 41 via the upper electrode 49 and the lower electrode 50, blue to violet light is emitted from a side face by exciton luminescence. Since each of the layers 46 to 47 of the light emitting section 44 has the positive plane, the light emitting section 44 has high crystallinity and the light emitting device 41 has high brightness and high luminescent efficiency.

What is claimed is:

1. A light emitting device comprising a substrate having a first light emitting piezoelectric film thereon, wherein the first piezoelectric film has a polar plane.

2. A light emitting device according to claim 1, wherein the substrate is selected from the group consisting of a c-plane sapphire substrate, an R-plane sapphire substrate, an m-plane sapphire substrate, an a-plane sapphire substrate, a rotated Y-cut plate sapphire substrate, a double rotated sapphire substrate, a rotated Y-cut plate quartz substrate, a Z-plane quartz substrate, a $LiTaO_3$ substrate having a negative Z plane of a rotated Y-cut plane, and a $LiNbO_3$ substrate having a negative Z plane of a rotated Y-cut plane, and wherein the first piezoelectric film has a positive plane.

3. A light emitting device according to claim 2, wherein the first piezoelectric film comprises a material selected from ZnO, AlN and CdS.

4. A light emitting device according to claim 2, wherein the first piezoelectric film comprises ZnO.

5. A light emitting device according to claim 2, further comprising a second piezoelectric film, wherein the first piezoelectric film and the second piezoelectric film are doped with impurities of different conductivity types to form a p-n junction.

6. A light emitting device according to claim 2, further comprising a plurality of metal film stripes on the substrate, wherein the first piezoelectric film is provided so as to cover the plurality of metal film stripes, and portions of the first piezoelectric film on the plurality of metal film stripes has a negative plane.

7. A light emitting device according to claim 1, wherein the substrate is selected from the group consisting of a $LiNbO_3$ substrate having a positive Z plane of a rotated Y-cut plate $LiNbO_3$ substrate, a $LiTaO_3$ substrate having a positive Z plane of a rotated Y-cut plate $LiTaO_3$ substrate, a $LiTaO_3$ substrate having a positive Z plane, a $LiNbO_3$ substrate having a positive Z plane, a glass substrate, a Si substrate, a metal substrate, and a substrate having a metal film thereon, and wherein the first piezoelectric film has a negative plane.

8. A light emitting device according to claim 7, wherein the first piezoelectric film comprises a material selected from ZnO, AlN and CdS.

9. A light emitting device according to claim 7, wherein the first piezoelectric film comprises ZnO.

10. A light emitting device according to claim 7, further comprising a second piezoelectric film, wherein the first piezoelectric film and the second piezoelectric film are doped with impurities of different conductivity types to form a p-n junction.

11. A light emitting device according to claim 1, wherein the first piezoelectric film comprises a material selected from ZnO, AlN and CdS.

12. A light emitting device according to claim 1, wherein the first piezoelectric film comprises ZnO.

13. A light emitting device according to claim 1, further comprising a second piezoelectric film, wherein the first piezoelectric film and the second piezoelectric film are doped with impurities of different conductivity types to form a p-n junction.

14. A method for making a light emitting device comprising the steps of:
    providing a substrate; and
    forming a first light emitting piezoelectric film on the substrate under conditions such that the surface of the film opposite the substrate has a polar plane.

15. A method for making a light emitting device according to claim 14, wherein the substrate is selected from the group consisting of a c-plane sapphire substrate, an R-plane sapphire substrate, an m-plane sapphire substrate, an a-plane sapphire substrate, a rotated Y-cut plate sapphire substrate, a double rotated sapphire substrate, a rotated Y-cut plate quartz substrate, a Z-plane quartz substrate, a $LiTaO_3$ substrate having a negative Z plane of a rotate Y-cut plate, and a $LiNbO_3$ substrate having a negative Z plane, and the first piezoelectric film is formed under conditions such that said surface is positive.

16. A method for making a light emitting device according to claim 15, wherein the first piezoelectric film comprises a material selected from ZnO, AlN and CdS.

17. A method for making a light emitting device according to claim 14, wherein the substrate is selected from the group consisting of a $LiNbO_3$ substrate having a positive Z plane of a rotated Y-cut plate $LiNbO_3$ substrate, a $LiTaO_3$ substrate having a positive Z plane of a rotated Y-cut plate $LiTaO_3$ substrate, a $LiTaO_3$ substrate having a positive Z plane, a $LiNbO_3$ substrate having a positive Z plane, a glass substrate, a Si substrate, a metal substrate, and a substrate having a metal film thereon, and the first piezoelectric film is formed under conditions such that said surface is negative.

18. A method for making a light emitting device according to claim 17, wherein the first piezoelectric film comprises a material selected from ZnO, AlN and CdS.

19. A method for making a light emitting device according to claim 14, wherein the first piezoelectric film comprises a material selected from ZnO, AlN and CdS.

20. A method for making a light emitting device according to claim 14, further comprising forming a second piezoelectric film on the first piezoelectric film under conditions such that the second piezoelectric film has a polarity differing from that of the first piezoelectric film.

* * * * *